United States Patent [19]

Drawl et al.

[11] Patent Number: 4,992,082
[45] Date of Patent: Feb. 12, 1991

[54] METHOD OF TOUGHENING DIAMOND COATED TOOLS

[75] Inventors: William R. Drawl, State College, Pa.; Robert C. McCune, Birmingham, Mich.

[73] Assignee: Ford Motor Company, Dearborn, Mich.

[21] Appl. No.: 450,700

[22] Filed: Dec. 14, 1989

Related U.S. Application Data

[62] Division of Ser. No. 296,469, Jan. 12, 1989.

[51] Int. Cl.$^5$ ............................................... B24B 1/00
[52] U.S. Cl. ...................................... 51/295; 51/298; 428/249
[58] Field of Search ................... 51/295, 298; 428/249

[56] References Cited

U.S. PATENT DOCUMENTS

| | | | |
|---|---|---|---|
| 4,242,106 | 12/1980 | Morelock | 51/295 |
| 4,652,274 | 3/1987 | Boettcher et al. | 51/298 |
| 4,707,384 | 11/1987 | Schachner et al. | 427/249 |
| 4,789,385 | 12/1988 | Dyer et al. | 51/295 |
| 4,871,377 | 10/1989 | Frushour | 51/295 |

Primary Examiner—Karl Group
Assistant Examiner—Willie J. Thompson
Attorney, Agent, or Firm—Joseph W. Malleck; Roger L. May

[57] ABSTRACT

Method of toughening the structure of a diamond or diamond-like coated tool, by the steps of: (a) depositing, by low pressure CVD, a plurality of layers of separated diamond or diamond-like particles onto a nondiamond or nondiamond-like tool substrate (i.e., SiAlON, $Si_3N_4$, SiC, Si, Ti, Co cemented WC, TiC, Ni-Mo cemented TiCN), the substrate being selected to facilitate diamond or diamond-like deposition and to retain its strength-related properties after such CVD; and (b) interposing a mechanically adherent, planarized binding material (i.e. transition metals, silicon, boron) between and on said layers of particles and across the separated particles of each particle layer, said binding material being substantially devoid of diamond graphitizing or dissolution agents. A barrier layer is deposited onto said tool substrate prior to step (a) to prevent the egress of chemicals capable of graphitizing diamond or diamond-like particles. The total thickness of the coating structure is about 50–125 microns.

2 Claims, 7 Drawing Sheets

Depositing, by low pressure CVD, a plurality of layers of separated diamond or diamond-like particles onto a nondiamond or diamond-like tool substrate, the substrate being selected to facilitate diamond or diamond-like deposition and to retain its strength related properties after CVD Interposing a mechanically adherent, planarized binding material between and on said layers of particles and across the separated particles of each particle layer, the binding material being substantially devoid of diamond graphitizing or dissolution agents.

Fig. 1

METHOD OF TOUGHENING DIAMOND COATED TOOLS

This is a division of application Ser. No. 07/296,469, filed Jan. 12, 1989.

BACKGROUND OF THE INVENTION

1. Technical Field

This invention relates to the art of synthesizing diamond and hard carbon films and, more particularly, to the art of adhering such films to the working surface of cutting or forming tools.

2. Discussion of the Prior Art

The synthesis of diamond under high pressure and high temperature conditions (HPHT) is a well-known success, originating with its announcement in 1955; several tons of industrial diamond abrasive grain are made this way each year in various factories around the world (see R. H. Wentorf, R. C. DeVries, and F. P. Bundy, "Sintered Superhard Materials", *Science*, Vol. 208, p. 873 (1980); and J. C. Walmsley, "The Microstructure of Ultrahard Material Compacts Studied by Transmission Electron Microscopy", Proceedings of International Conference on Science of Hard Materials, Nassau, Bahamas, November 1987). Unfortunately, current HPHT synthesis schemes do not permit direct coating of tool materials without detrimentally affecting such tool materials; the cost, inability to cover large areas, and complexity of making controlled diamond by this process is high.

Only in the last few years has it been possible to produce diamond crystals by low pressure chemical vapor deposition (CVD). The possibility of synthesis of diamond under metastable conditions, i.e., in the graphite stable region, is based on the small free energy difference between diamond and graphite under ambient conditions. By using atomic hydrogen during such synthesis, diamond will be favored to deposit from a hydrocarbon vapor. The presence of atomic hydrogen appears to be the key ingredient because it removes graphite or prevents its formation while promoting the crystalization of diamond in the metastable state (see R. Messier, K. E. Spear, A. R. Badzian, and R. Roy, "The Quest For Diamond Coatings", *Journal of Metals*, Vol. 39 [No. 9], page 8, (1987); and R. C. DeVries, "Synthesis Of Diamond Under Metastable Conditions", *Annual Reviews of Materials Science*, Vol. 17, page 161, (1987)). The conversion process, assisted by the use of a variety of thermal techniques including heated filaments and microwave plasma, can be considered for use on some tool materials.

In many of the early investigations, there was little concern for micromorphology and adhesion to a substrate. In later investigations, it was observed that crystals appeared more readily at scratches on the substrate; such substrates were formed of materials familiar to the semiconductor art, such as silicon, copper, tungsten, and molybdenum (see Y. Mitsuda, Y. Kojima, T. Yoshida and K. Akashi, "The Growth Of Diamond in Microwave Plasma Under Low Pressure", *Journal of Materials Science*, Vol. 22, page 1557 (1987); B. V. Spitsyn, L. L. Bouilov and B. V. Derjaguin, "Vapor Growth Of Diamond On Diamond And Other Surfaces", *Journal of Crystal Growth*, Vol. 52, page 219 (1981); S. Matsumoto, Y. Sato, M. Tsutsumi and S. Setaka, "Growth Of Diamond Particles From Methane-Hydrogen Gas", *Journal of Materials Science*, Vol. 17, page 3106 (1982); and A. R. Badzian, T. Badzian, R. Roy, R. Messier and K. E. Spear, "Crystallization Of Diamond Crystals And Films By Microwave Assisted CVD (Part II)", *Materials Research Bulletin*, Vol. 23, page 531 (1988)).

When research investigators turned their attention to the adhesion of diamond coatings to a substrate, such as for cutting tools, they found the coatings suffered (see Y. Yagi, K. Shibuki and T. Takatsu, "Adhesion Strength Of Diamond Films On Cemented Carbide Substrate", presented at the 15th International Conference on Metallurgical Coatings, April 11–15, San Diego, Calif. (1988)).

In various efforts, the wettability of diamond by metals has been investigated. The affinity of titanium, nickel, cobalt, manganese, chromium, molybdenum, and iron for diamond is made evident by such works as: Yu. V. Naidich and G. A. Kolesnichenko, "Study of the Wetting of Diamond and Graphite by Liquid Metals II. Angles of Contact and Adhesion Between Tin-Titanium and Copper-Tin-Titanium Alloys and the Graphite Surface", *Poroshkovaya Metallurgiya* 1 (13) p. 49 (1963); Yu. V. Naidich and G. A. Kolesnichenko, "Investigation of the Wetting of Diamond and Graphite by Molten Metals and Alloys III. The Wetting of Diamond Crystals", *Poroshkovaya Metallurgiya* 3 (21) p. 23 (1964); Yu. V. Naidich and G. A. Kolesnichenko, "Investigation of the Wetting of Diamond and Graphite by Molten Metals and Alloys IV. Influence of Temperature on the Adhesion of Metals Inert to Carbon", *Poroshkovaya Metallurgiya* 2 (38) p. 97 (1966); and Yu. V. Naidich and G. A. Kolesnichenko, "Investigation of the Wetting of Diamond and Graphite by Molten Metals and Alloys V. Carbide Formation Kinetics at the Graphite/Metallic Melt Interface", *Poroshkovaya Metallurgiya* 2, p. 76 Feb. 1968. To effect wetting, the above investigations heated the materials to above 1100° C. for time periods of at least 10 minutes duration. Such heating would promote graphitization or dissolution of thin diamond coatings and thus makes the results of such investigations not usable for promoting improved diamond coated tools. If such wetting metals were deposited by chemical vaporization techniques, the temperature of processing (above 600° C.) for a necessary period of time (i.e., 30 minutes) would cause graphitization and/or dissolution of deposited diamond or diamond-like particles. Lower temperature depositions of refractory metals is possible using plasma-activated CVD processes (PACVD), but such technology falls far short of knowing how to obtain adherence to cemented nonmetal substrates and how to convert to a platform that stimulates diamond growth (see J. A. Sheward and W. J. Young, "The Deposition of Molybdenum and Tungsten Coatings on Gun Steel Substrates by a Plasma Assisted CVD Technique", *Vacuum*, Vol. 36, p. 37 (1986)).

Such accumulated knowledge is not able to provide a tougher, robust, and lower cost diamond coated tool without degrading the effectiveness or cost competitiveness of the tool for finish machining. Such tougher, robust, coated tools must be more resistant to cracking, loss of adhesion, and ultimate spallation; the composite tool must have higher hot strength, better thermal conductivity, and improved accommodation of the widely differing physical properties of the substrate and diamond or diamond-like particles applied thereto.

An obvious advantage of CVD is the lower cost to fabricate a diamond or diamond-like coating on a tool substrate. The requisite temperature for such CVD, coupled with the necessity that the substrate be capable of forming a carbide to facilitate nucleation of diamond, restricts the selection of substrate materials essentially to transition metals and their carbides, and forms of silicon. In the case of transition metal carbides, the grains are usually cemented together by use of metals or alloys (i.e., Co, Ni, Fe) which, unfortunately, are catalytically active to diamond, causing graphitization and an attendant reduction of properties. Such catalytically-active metals poison the diamond-creating potential of CVD and must be overcome.

The problems facing developers of industrially-robust diamond coated tools remain. One of these is the nature of the CVD process which requires that the substrate be subjected to a temperature of about 1000° C., which basically eliminates the use of many types of tool substrates and restricts the selection to high temperature resistant substrates that generally are not strong in tension. A second problem involves adherence and mechanical strength of the coating in contact with the supporting substrate. There are very few substrate materials, and almost none commercially, which can tolerate both the high temperatures of the current deposition process as well as provide sufficient mechanical support to sustain the internal stresses which are developed in a continuous diamond film due to the exceptionally low coefficient of thermal expansion of diamond and its extremely high modulus of elasticity.

SUMMARY OF THE INVENTION

The method of this invention provides an economical process for toughening diamond or diamond-like coatings as applied to tools. The method comprises making a composite coated tool by the steps of: (a) depositing, by low pressure CVD, a plurality of layers of separated diamond or diamond-like particles onto a nondiamond or nondiamond-like tool substrate which is selected to facilitate such diamond or diamond-like deposition and to retain its strength-related properties after such CVD; and (b) interposing a mechanically adherent, planarized binding material between and on each of such particle layers, the binding material extending across the separated particles within each particle layer and being substantially devoid of diamond graphitizing agents. This method achieves what the prior art has not provided, a thick (greater than 15 microns), adherent, and robust diamond-containing coating system for cutting tools. Such coated tools wear better because of improved diamond crystal positioning and integrity; such tools cut smoother because of a planarized exposed cutting surface.

A planarized coating is one that is smoother and has less conformity to the contours of its supporting surface. Planarization of the binding material is effected by use of physical vapor deposition at temperatures below 500° C. in which binding material particles are impelled for greater impact to cause back scattering of the deposited binding material and thereby erode the peaks and fill in the valleys of the morphology of the binder deposition. Preferably, particles of the binder material can be sputtered from a target and impelled for greater impact by negatively biasing the tool substrate or workpiece to constitute a secondary cathode (i.e., 25–500 electron volts). The ion bombardment from sputtering creates surface defects which increases nucleation sites for diamond, increases density of diamond deposit, and increases mechanical stress of binding material on diamond and substrate.

The binding material is mechanically adhered to the tool substrate by (i) the force of ion impact or bombardment, and (ii) the shrink force resulting from heating previously deposited binding material layers to the CVD growth temperature for diamond coating and thence cooling to room temperature. This heating and cooling cycle is repeated several times in accordance with the number of layers employed.

A continuous barrier film or layer is preferably deposited by low pressure CVD onto the tool substrate prior to any deposition of diamond particles to provide a platform on which diamond particles will more effectively nucleate and which prevents egress of chemicals contained by the substrate that poison diamond nucleation. The substrate will often be a metal bonded carbide, which metals (i.e., Co, Ni, Fe) are catalytically active to diamond, causing graphitization and attendant reduction of properties. The barrier film or layer is preferably selected from the group consisting of transition metals, transition metal carbides, boron, boron carbide, silicon, silicon carbide, and silicon nitride.

The diamond or diamond-like particles are deposited by a two-stage technique to ensure separation of the particles. The first stage comprises initiating chemical vapor deposition of such separated diamond or diamond-like particles onto the substrate by use of low pressure metastable deposition of carbon in the presence of atomic hydrogen and at a temperature that favors the nucleation of such particles, the substrate being selected to facilitate such diamond or diamond-like deposition (i.e., substrate constituted of a carbide or carbide former). The particles are formed from a nucleus of four-coordinated carbon atoms with $sp^3$ bonding. The second stage comprises substantially suppressing nucleation of additional particles before formation of a contiguous film of such particles takes place, while permitting the existing particles to grow to a predetermined maximum crystal size consistent with separated crystals.

Chemical vapor deposition of the diamond or diamond-like particles comprises metastable thermal decomposition of a hydrocarbon gas containing hydrogen (such as 0.5% by volume methane and the remainder essentially hydrogen). Such deposition may be carried out with the use of heterogeneous diamond seeding on the surface or by homogeneous carburizing nucleation directly onto the surface. The presence of atomic hydrogen from such gas is facilitated such as by microwave plasma discharge heating or by filament heating. Nucleation is assured by maintaining the substrate temperature in the range of 600°–950° C. with the deposition chamber pressure in the range of 50–100 Torr. Suppression of nucleation is carried out by raising the substrate temperature to at least 1000° C. The density of nucleation can be varied by varying the temperature of the substrate within such range or by varying the roughness and defect sites in the substrate surface.

The tool substrate is preferably selected to retain strength related properties (i.e., fracture toughness and thermal shock resistance) after exposure to temperatures of up to 1050° C. for 20 hours; the substrate preferably is selected from the group consisting of SiAlON, $Si_3N_4$, SiC, W, Si, Ti, Co cemented WC, TiC, Ni-Mo alloy cemented TiCN. The binding material is a refractory carbide former and is preferably selected from the group consisting of Ti, Ni, Co, Mn, Cr, Mo, W, Zr, Ta, Si, Hf, and Fe.

SUMMARY OF THE DRAWINGS

FIG. 1 is a flow diagram of the process steps of this method invention;

DETAILED DESCRIPTION AND BEST MODE

Figure 2A:
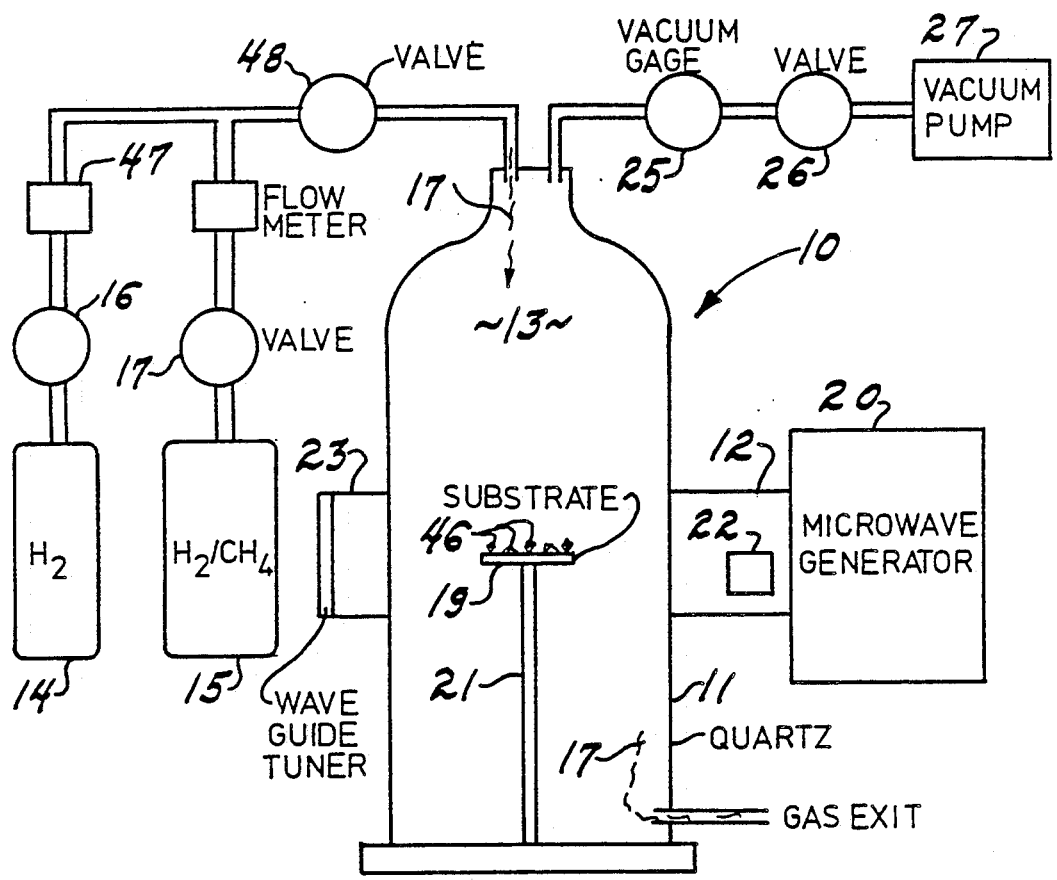
FIG. 2a is a diagramatic illustration of apparatus useful in carrying out the chemical vapor deposition portion of the invention herein by microwave plasma discharge.

The method and structure of this invention provide a diamond or diamond-like coated tool surface which overcomes mechanical weakness of the coated structure by use of several layers of CVD diamond or diamond-like particles, each layer being generally nonconformal in microcontour to the surface of the substrate by the separation of the particles, and the interposition of continuous binding material layers or films by PVD between the particle layers to generally restore conformance of the exposed microcontour of the coated structure to a smoother surface which enhances finish machining and promotes mechanical toughness.

Before proceeding with explanation of the detailed process, it is of some importance to define the structure of diamond particles and diamond-like particles, and to explain what is meant by metastable molecular processes during low pressure diamond growth.

A diamond particle is a special cubic lattice grown from a single nucleus of four-coordinated carbon atoms. The diamond-cubic lattice consists of two interpenetrating face-centered cubic lattices, displaced by one quarter of the cube diagonal. Each carbon atom is tetrahedrally coordinated, making strong, directed $sp^3$ bonds to its neighbors using hybrid atomic orbitals. The lattice can also be visualized as planes of six-membered saturated carbon rings stacked in an ABC ABC ABC sequence along <111> directions. Each ring is in the "chair" conformation and all C—C bonds are staggered.

A lattice with hexagonal symmetry, lonsdaleite, can be constructed with the same tetrahedral nearest neighbor configuration. In lonsdaleite, however, the planes of chairs are stacked in an AB AB AB sequence. The C—C bonds normal to these planes are eclipsed. In simple organic molecules, the eclipsed conformation is usually less stable than the staggered because steric interactions are greater.

Thermodynamically, diamond is slightly unstable with respect to crystalline graphite. At 298 K and 1 atm the free energy difference is 0.03 eV per atom, only slightly greater than kT (here k is the Boltzmann Constant and T is the absolute temperature). Diamond has the highest atom number density of any material at terrestrial pressures. As a result of its high atom-number density and the strong covalent bonding, diamond has the highest hardness and elastic modulus of any material and is the least compressible substance known. The thermal conductivity of diamond at 300 K is higher than that of any other material and its thermal expansion coefficient at 300 K is $0.8 \times 10^{-6}$, lower than that of Invar.

Diamond-like hydrocarbons are essentially diamond with approximately 0.2–0.6 atom fraction hydrogen; density increases with hydrogen content contrary to conventional hydrocarbons (always greater than 0.19 gram-atom per cubic centimeter). Diamond-like hydrocarbons have hydrogen to stabilize the $sp^3$ sites; such hydrocarbons have microhardness values of 3000–5000 kg $mm^{-2}$, compared to 2000–3500 kg $mm^{-2}$ for SiC. The hardness of diamond-like hydrocarbons drops off markedly as the hydrogen content increases.

Diamond-like carbons are essentially carbon with some $sp^3$ bonding and with little or no hydrogen; they have atom number densities from 0.17 to 0.28 gram-atom per cubic centimeter. Such carbons utilize their medium or long range order to stabilize the $sp^3$ carbon sites and approach the physical properties of diamond.

Nature of Low Pressure Diamond Growth

Metastable diamond growth at low pressure is of relatively recent origin. Techniques, of use to this invention, for growing diamond metastably may be conveniently divided into three categories: hot filament chemical vapor deposition (HFCVD); high frequency plasma-assisted chemical vapor deposition (PACVD); and DC plasma discharge. Hybrid techniques, for example, hot filaments immersed in a plasma discharge, have also been used.

In HFCVD, a tungsten filament or foil at 2000 to 2800 K is used to dissociate gas mixtures containing from 0.2 to 2.0% $CH_4$ in $H_2$, typically at about 6000 Pa but also up to atmospheric pressure. The dissociation products at these temperatures consist mainly of radicals, for example, $CH_2$, $C_2H$, and CH, and atomic hydrogen, as well as unreacted $CH_4$, acetylene, and $H_2$. Filaments of W, Ta, and Mo have been used to produce diamond. The filament is typically placed within 1 cm of the substrate surface to minimize thermalization and radical recombination. However, radiation heating can produce excessive substrate temperatures leading to nonuniformity and even graphitic deposits. Withdrawing the filament slightly and biasing it negatively to pass an electron current to the substrate assists in preventing excessive radiation heating.

Microwave and RF (radio frequency) methods in which the substrate is removed from the plasma can be used. Diamonds can be grown in microwave discharges in a magnetic field, under conditions where electron cyclotron resonance is considerably modified by collisions. These "magneto-microwave" plasmas can have significantly higher densities and electron energies than isotropic plasmas and can be used to deposit diamond over large areas.

The basic obstacle to crystallization of diamond at low pressures is the difficulty in avoiding codeposition of graphite and/or amorphous carbon when operating in the thermodynamically stable region of graphite. In general, the possibility of forming different bonding networks with carbon atoms is understandable from their ability to form different electronic configurations of the valence electrons. These bond types are classified as $sp^3$, $sp^2$, $sp^1$ and are related to different carbon allotropes, diamond and lonsdaleite, graphite, and carbenes, respectively.

In heterogenous decomposition reaction of $CH_4$ on a substrate occurring under thermal equilibrium at about 900° C. and at a pressure less than 50 Torr, deposition of diamond will start at the edge or step on a face where the crystal field is especially strong when the equilibrium concentration of carbon atoms or hydrocarbon molecules is exceeded. The process continues until the surplus of carbon atoms is consumed. Building diamond on diamond is called homoepitaxy or autoepitaxy; on nondiamond substrates, the growth is heteroepitaxial or nonepitaxial. The formation of a nucleus of critical size emerges as a result of a balance between contributions from volume and surface energies. In general, this balance is dependent on fluctuations in the chaotic motion of atoms. Exceeding a critical size is necessary before stable growth of the new phase will occur, and there is a finite probability for this event. The number of nuclei will depend on temperature, supersaturation, and state (structure, roughness, etc.) of the substrate.

Metastable synthesis of diamond must control the deposition process in such a way that subcritical nuclei of diamond (the metastable phase) will grow above the critical size necessary to stabilize further growth, but simultaneously to prevent subcritical nuclei of graphite (the thermodynamically stable phase) from achieving critical size. Success of diamond synthesis far from the equilibrium conditions depends on finding crystallization conditions for the metastable phase when growth of the stable phase (graphite) has been stopped. Use of hydrogen makes possible low pressure gas phase crystallization of diamond.

In the presence of atomic hydrogen, the principal surfaces of diamond are likely to be saturated with hydrogen. Because the H—H bond energy is greater than the C—H bond energy, atomic hydrogen will both add to vacant surface sites, $S^o$, and abstract hydrogen from filled sites, S—H $$S^o + H^o \rightarrow S-H \qquad (1)$$

$$S-H + H^o \rightarrow S^o + H_2 \qquad (2)$$

Reactions 1 and 2 are exothermic. The required energy is supplied by the energy added to dissociate $H_2$ ($H_2 \rightarrow 2H^o$). Because of the dynamic interaction between atomic hydrogen and the surface, there will be a steady-state concentration of free surface sites, $S^o$, which can undergo reactions with carbon-containing species, R, for example, $$S^o + R^\cdot \rightarrow S-R \qquad (3)$$

The nature of the growth sites can be either intermediate for diamond growth that is a single-carbon-atom species (for example, involving $CH_3$ radicals and $CH_3$ ions) or a two-carbon-atom species (for example, acetylene). It has been shown that the growth rate by thermal CVD was first order in methane partial pressure and one-half order in ethylene partial pressure. This result is strong evidence that one step in these experiments involved a single-carbon-atom species but does not preclude the easy addition of acetylenic species in later steps.

Plasma chemistry can affect the deposit in other ways. For example, at low pressures the dissociation of $H_2$ ($H_2 \rightarrow 2H$) increases, and the population of excited hydrogen (H*) increases as well. The level of ionization increases because a major ionization channel is through excited states. Consequently, the ratio of ion to neutral fluxes at the substrate increases. In DC plasmas, ion bombardment at the cathode is enhanced.

Barrier Layer

Figure 3:
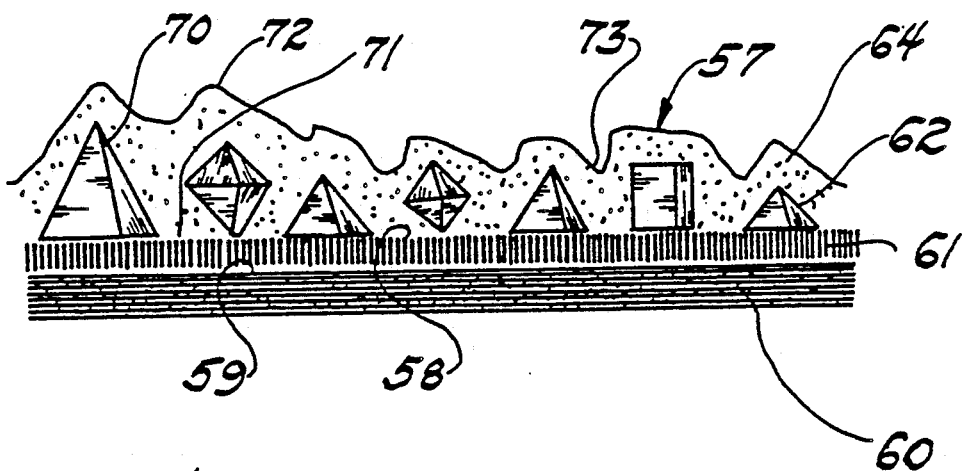
FIG. 3 is a schematic illustration of the noncontiguous (separated) diamond particles deposited on a tool substrate and grown in accordance with a first stage of this invention, and including a preliminary planarized binding layer deposited over the noncontiguous diamond particles.

The diamond particle composite coating structure of this invention is applicable to various substrate materials generally utilized for cutting tool inserts, solid carbide tools, and wear resistant components. FIG. 3 schematically illustrates an embodiment of the proposed structure in which the substrate 60 is chosen from among tool insert, or other materials, having strength related physical properties not degraded by exposure of the substrate to coating temperatures necessary for the diamond deposition and associated process steps. The necessary strength related physical properties which the tool substrate must possess usually include high fracture toughness and high thermal shock resistance. Typical materials will be apparent to those skilled in the art, and include silicon and its carbides or nitrides, and families of cobalt cemented tungsten carbide, nickel-molybdenum alloy cemented titanium carbide, and other similar families, formed by powder metallurgical processing of various transition metal carbides, nitrides, borides or carbonitrides. The transition metal compounds are bonded by metallic phases which include metals, predominatnly of the transition series, such as cobalt, nickel, and iron. Unfortunately, the bonding metals are catalytically active to diamond or diamond-like particles, causing graphitization and degradation. To prevent the egress of such chemicals from the substrate to the coating layers, a continuous barrier layer 61 is interposed. It is comprised of a deposit of pure metal or metallic carbide, nitride, or boride which (i) provides a platform facilitating nucleation and growth of diamond particles in subsequent deposition steps, such facility usually being possessed by carbide formers, (ii) acts as a chemical barrier to prevent egress of destabilizing elements from the underlying substrate, such as cobalt and nickel, and (iii) accommodates thermally induced mismatch strains between subsequently grown diamond particles or film segments and the substrate material as the assembly is cooled from the deposition temperature.

Materials which meet these requirements are found among the transition metal carbide forming elements, exemplary materials being titanium, tantalum, molybdenum, niobium, hafnium, zirconium, and tungsten, and the carbide forming elements of silicon and boron. Excellent nucleation and growth of diamond particles has been achieved on a titanium carbide barrier layer formed by chemical vapor deposition on a C-2 grade of cobalt cemented tungsten carbide. Although the thickness of such barrier layer can be varied, it may be 1–5 microns thick to provide the necessary chemical platform for diamond nucleation and barrier layer.

Metals for such barrier layer can be deposited by CVD techniques using the same reaction chamber as that used for the eventual coating of diamond or diamond-like particles. The barrier metal is converted to a carbide in the initial stages of CVD of the diamond or diamond-like particles; the carbon in the diamond activation gas is dissolved into the barrier metal on a priority basis prior to nucleation of the diamond or diamond-like particles. The exposed carbide surface 58 of the barrier layer 61 is necessary to support nucleation thereafter. Such exposed surface 58 conforms to the surface of the substrate 60 and will be generally smooth.

Noncontiguous Growth

Figure 4:
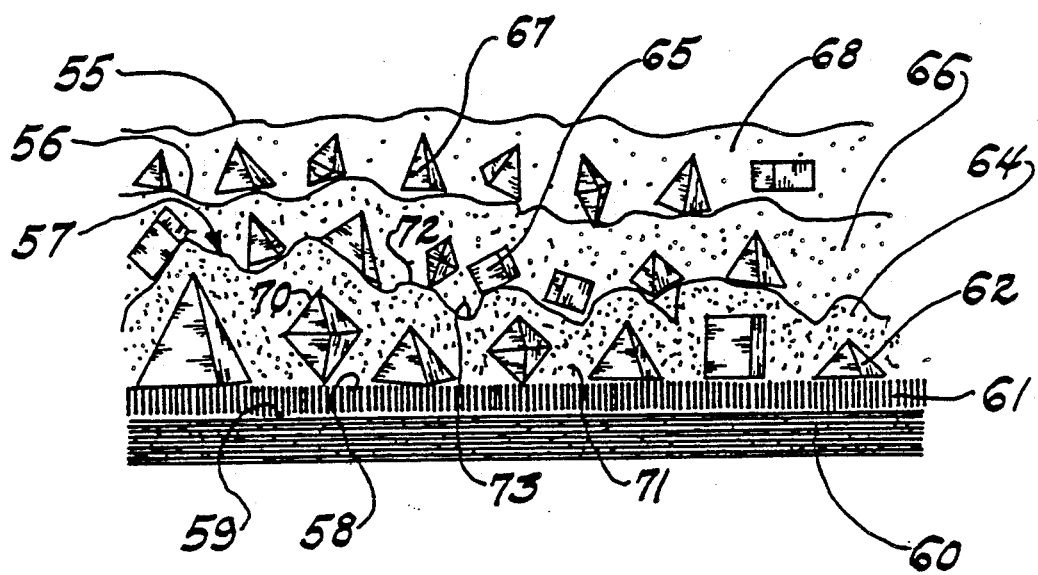
FIG. 4 is a schematic illustration of a plurality of diamond particle layers with planarized binding matrial interposed between and on the plurality of diamond layers.

As shown in FIGS. 3 and 4, a plurality of layers of diamond or diamond-like layers 62, 65, 67 are deposited by low pressure CVD onto the carburized surface 58 of barrier layer 61 or onto the substrate 60 itself. In the method hereof, low pressure CVD is carried out by biasing the free energy of a hydrogen-hydrocarbon gas mixture, surrounding the tool substrate, to form atomic hydrogen and deposit diamond or diamond-like particles 62 (FIG. 3) with $sp^3$ bonding. The nucleation of such particles is controlled heterogeneously either through the use of diamond seed particles, or through carburization nucleation. Carburization nucleation is clearly preferred because seeding tends to promote slightly more rapid lateral growth, and seeded depositions on TiC or Co cemented WC may not permit fully adherent coatings to be formed. In either case, the nucleation phase of the diamond or diamond-like growth is controlled and limited so as to ensure noncontiguous diamond particles. For purposes of this invention, diamond particles are clearly preferred because diamond-like depositions are more likely to form a continuous film rather than nucleate and grow as separated crystallites.

Once nucleation of the particle deposition process has been established by seeding or by carburization of the substrate to a desired density, nucleation is suppressed or stopped by raising the temperature of the substrate to a point at which such suppression occurs and growth of existing particles becomes the dominant feature of the deposition process. The exact temperature for onset of this behavior is a complex function of substrate materials, gas phase composition, and conditions within either the hydrocarbon plasma or high temperature vapor stream, but will generally be about 1000° C.

With the diamond crystal particles in a noncontiguous condition, the use of a metallized coating thereover secures the diamond particles not only to the binder, but the binder may promote a brazement between the substrate, diamond, and binder, thereby providing additional mechanical stability limiting fracture or deadhesion of the diamond particles from the tool surface.

Noncontiguous particles are deposited by a two-stage sequence. In the first stage, a tool substrate is selected from materials that can retain the necessary strength-related physical properties after exposure to processing temperatures of CVD, such as up to 1050° C. for 20 hours. In this stage, assuming a barrier layer is in place if necessitated by the chemistry of the substrate, CVD is initiated to deposit an array of separated diamond particle nuclei onto the tool substrate by use of low pressure metastable gas phase deposition. This involves biasing the free energy of a hydrogen-hydrocarbon gas mixture surrounding the substrate to form atomic hydrogen and thereby deposit diamond nuclei under metastable conditions. To favor nucleation only, the substrate temperature is maintained in the range of 600°-950° C. and advantageously to attain a nuclei or particle density of one particle per 100 $\mu m^2$.

In the second stage, CVD is interrupted before formation of a contiguous crystal film by raising the temperature of said surrounding gas to stimulate crystal growth of said array of separated crystal nuclei and cease crystal seeding. To substantially suppress nucleation the temperature of the substrate must be raised to a temperature of at least 1000° C. The raised temperature is continued until the particles attain a desired size, preferably up to 10 microns and at a growth such as at a desired rate of 3-5 $\mu m/hr$. As part of this stage, the coated substrate may be cooled to evolve hydrogen therefrom.

CVD is preferably assisted and carried out by microwave plasma discharge apparatus 10 as shown in FIG. 2a. A quartz tube 11 is set across a microwave guide tube 12 which serves as the plasma deposition furnace or chamber 13. Hydrogen and methane are used as reactants supplied from tanks 14 and 15. The reactants were controlled by valves 16 and 17 to achieve a predetermined gas mixture 18 with methane constituting 0.5-2.5 volume percent and the remainder essentially hydrogen; the gas mixture was controlled to a flow rate through the chamber of about 60-100 sccm during active deposition. Microwave plasma was generated to heat the gas mixture 17 in the chamber and a substrate 19 placed therein. A microwave power supply 20 of 2.45 gigahertz (GH$_z$) rating was used with actual power at about 300-500 watts. The microwave plasma is created by the guide tubes 12, a power monitor 22, and a tuner 23. After tuning, the plasma will be confined to the center of the quartz tube 11. The substrate or tool insert is secured to a holder 21 and susceptor comprised of boron nitride or graphite. The pressure control system 24 has a pressure gauge 25, valve 26, and a vacuum pump 27 to achieve chamber pressures of 1-110 Torr. Diamond deposition predominates at pressures above 4 Torr; pressures useful for low pressure metastable CVD are preferably in the 30-100 Torr range and optimally about 80-90 Torr.

Nucleation of separated diamond or diamond-like particles is assured by (i) maintaining the substrate temperature in the range of 600°-950° C., (ii) controlling the substrate surface roughness to be no finer than a predetermined amount, and (iii) limiting deposition time to prevent particle size growth up to a predetermined maximum to prevent becoming contiguous. Treating or polishing the substrate surface with hard powder (diamond or SiC powder) in the particle size range of #100-1000 may give lower density nucleation; abrading may influence the sites for nucleation and seeding density will do the same. However, by limiting the nucleation deposition time to typically 4-10 hours, the density of about one particle per 100 $\mu m^2$ of substrate surface can be achieved. The higher the temperature within the nucleation temperature range of 600°-950° C., the lowerr the density of nucleation. Thus, controlling the temperature, as well as treating the substrate surface, offers control of nucleation density to assure separation of most particles.

Figure 2B:
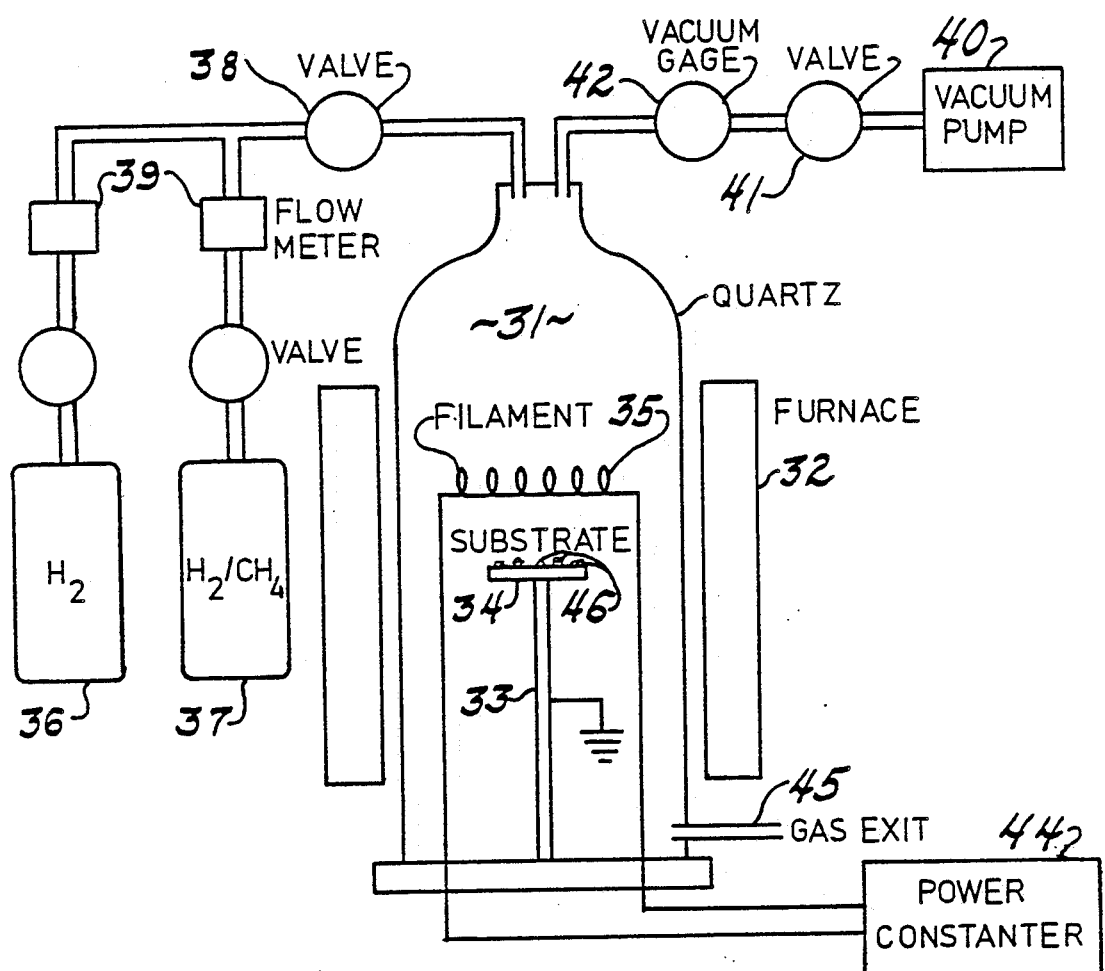
FIG. 2b is a diagramatic illustration of apparatus useful in carrying out chemical vapor deposition by hot filament.

Low pressure chemical vapor deposition can also be carried out with the use of apparatus such as shown in FIG. 2b. The reactor assembly 30 includes a reaction chamber 31, a furnace 32, a support 33 for a tool substrate 34, and a filament 35 for assisting the heating of the substrate surface to be coated. The gas supply is provided with separate canisters 36, 37 of relatively pure hydrogen, and a mixture of hydrogen and methane with the overall methane concentrations being restricted to a percentage of about 0.5-2.5% by volume. The gas flow from the canisters is admitted by way of a needle valve 38 or electronic mass-flow controller which controls the flow to that desired, utilizing flow meters 39. The pressure of the reaction chamber 31 is controlled by use of a vacuum pump 40 which in turn is controlled by use of a needle valve 41 operated in response to the degree of vacuum indicated by a gauge 42.

Preferably, conditions for stimulating the nucleation of noncontiguous diamond or diamond-like crystals by filament assisted CVD, include: a temperature for a tantalum filament of about 1800° C., temperature for the substrate of about 600°-950° C., a gas pressure of at least 5 Torr, a gas composition of 0.5% $CH_4$, with the balance $H_2$, and total gas flow rate of 30 sccm, and a deposition time of about 5-22 hours. The tantalum filament is heated by an AC source and placed above the substrate, which preferably is cleaned ultrasonically in acetone. After flushing the reaction chamber with pure hydrogen and heating the electric furnace to the selected deposition temperature, the tantalum filament is switched on and the reaction gas introduced for the selected deposition time. The substrate temperature is monitored by a suitable thermocouple placed beneath the substrate and the filament temperature is measured by an optical pyrometer.

It may be possible to alternatively place the substrate on an externally powered heating platen such that power (heat) may be applied to the substrate independent of plasma power or filament temperature.

The exact temperature at which nucleation yields to crystal growth is a complex function of substrate material, gas phase composition, and conditions for either the hydrocarbon plasma or high temperature vapor stream, but will generally be near 1000° C. (i.e., 975°-1025°). The conditions to promote crystal growth and cessation of the nucleation consist of changing the temperature of the substrate to at least about 1000° C. by increasing the microwave plasma discharge or by increasing the filament temperature (to i.e., 2300° C.). This interrupts the conditions necessary for nucleation.

In order to minimize deadherence of the diamond particles at the post-diamond deposition phase of processing, due either to thermal expansion coefficient mismatch or by action of entrained hydrogen gas from the plasma or vapor process, the substrate is then cooled from the deposition temperature and conditions of high vacuum such that the evolution of entrained hydrogen from the substrate is promoted. Preferably, the cooling rate is about 1° C./minute under a vacuum of at least $10^{-3}$ Torr.

Binding Material

As shown in FIG. 4, a plurality of mechanically adherent, planarized layers 64, 66 of binding material are deposited by PVD, one layer each is interposed between the diamond or diamond-like layers 62, 65, 67 and across the separated particles, and a final layer 68 is deposited as the outer, exposed surface. The binding material acts as a binder that aids in securing the diamond or diamond-like particles to its supporting surface and to provide the additional mechanical stability by a continuous solid film or coating which absorbs shock during a cutting operation and limits fracture or deadhesion of the diamond particles from the tool surface. Choice of the binder material will depend on the specific substrate. The binder phase will be chosen with the following properties: (i) ability to be deposited at low temperature (less than 600° C.), (ii) adhesion to and wetting of the supporting surface at both elevated and ambient temperatures, (iii) adhesion to diamond grains, (iv) resistance to cracking and spallation during subsequent metal cutting or forming operations, and (vi) excellent wear-resistant characteristics. Binder alloys for diamond-metal composites may be selected from the group including transition metals (Ti, Ta, V, W, Mo, Nb, Hf, Zr), transition metal carbides, boron, boron carbide, silicon, silicon nitride, and silicon carbide. Although nickel, cobalt, manganese, chromium, and iron can act as binding metals, they may have a graphatizing can or dissolution effect on the subsequently deposited diamond particles and should be avoided.

The vaporization temperatures of each of the elemental metals is exceedingly high, all above 1200° C.; at such high temperatures for a prolonged period, the diamond particles would be graphitized or dissolved and the substrate detrimentally affected even without the presence of catalytically active chemical agents. Thus, such binding material cannot be deposited by CVD unless the material can be deposited at a temperature under 500° C. Very few crack-resistant materials are known which can be deposited by CVD at under 500° C. and which can be effectively adhered to diamond or diamond-like particles and to the substrates contemplated herein. Tungsten is one such metal; it can be deposited by CVD at under 500° C. and converted by WC by the initial stage of diamond-forming CVD, thereby forming a desired platform for nucleation. However, such CVD-deposited refractory metal will not be planarized as a result of CVD. The transition metals designated above, or their alloys, not only can be deposited by low temperature techniques but can also be impinged or shrunk onto the diamond coated substrate by physical vapor deposition, such as ambient temperature sputtering, to offer unprecedented adherence. Physical vapor deposition of a uniform metal film by sputtering at ambient temperatures evolves the binding material from an alloy or elemental metal target.

The binding material is applied as a plurality of layers 64, 66, 68 for purposes of securing the diamond particles, and for providing mechanical integrity to the compact. The binding materials are chosen for their mechanical strength, method of deposition, and compatibility with diamond insofar as being among materials which bond to the surface without promoting graphitization or decomposition. The film is applied by physical vapor deposition. A particular advantage arises when the binding layer material is deposited within the same deposition system as the diamond layer, thus permitting more extensive composite structures to be fabricated without exposure of the structure to potentially contaminating external atmospheres. A further advantage arises when the binding material is deposited at sufficiently low temperature that upon cooling the structure from diamond deposition temperature to the temperature for physical vapor deposition, the structure will shrink rendering the layers in a state of compressive stress due to the greater thermal expansion coefficient of most binding materials relative to diamond. This will add to the mechanical stability of the compact.

The binding materials must (i) provide a platform which facilitates nucleation of subsequent diamond or diamond-like particles, and (ii) be deposited by a technique that provides for low temperature deposition (below 500° C.), and (iii) be devoid of chemicals that may poison diamond or diamond-like nucleation. Such binding materials can be selected from the group consisting of transition metals, transition metal carbides, silicon, silicon carbides and nitrides, boron carbides, and carbonitrides.

An important aspect of this invention is to planarize the binding material layers. The use of separated particles in each diamond or diamond-like layer creates a nonconforming surface on a microscale over the supporting surface or substrate. Such nonconformal surface would detract from the degree of finish surface of the workpiece being machined. To overcome this, the binding materials are planarized to smooth out the peaks 70 and valleys 71 created by such separated particles. To this end, negative biased substrate sputtering is employed. The substrate is connected to a negative DC voltage (i.e. 25-500 volts) to perform as a secondary cathode during sputtering. The increased impact of the ions of the binding material cause erosion of the peaks 72 forming on the binding material layer and cause back scattering of already deposited ions to fill in the valleys 73 of such forming layer. As a result, the exposed surface 57 will have a smoother, more conforming surface to that of the original substrate surface 59. As additional binding material layers are deposited, the newly created exposed surface, such as 55, will have progressively greater smoothness. As the layers are cycled in a temperature excursion between the temperature necessary for CVD and the lower temperatures (such as ambient) for PVD, the composite structure will shrink, applying enhanced adhering forces which add to the adherent forces resulting from ion bombardment during sputtering.

For bias sputtering to achieve planarization, it would be necessary to tailor the combination of metal binder and sputter gas to optimize the forward resputtering needed to achieve planarization. Metals such as titanium and molybdenum would thus be preferred in deference to an ability to resputter these metals with conventional gases such as argon, krypton, and xenon.

As shown in FIG. 4, the binding material layers 64, 66, 68 are interposed between and on the particle layers to provide alternating layers of diamond and binding material. Layer 64 represents a second deposition of the binding material followed by a third deposition of diamond or diamond-like particles 67. The alternating layers could, in principle, be repeated to any degree practical.

Where diamond particles remain covered by the binding material, it is expected that such material will be readily abraded on a "break-in" phase of machining or grinding exposing the embedded diamond particles.

EXAMPLES

For purposes of the best mode, a substrate tool material is chosen to be nickel-molybdenum cemented titanium carbonitride, diamond honed to its final configuration. The tool is cleaned in an organic solvent such as acetone prior to its insertion in a deposition chamber for application of the diamond particles.

Figure 5:
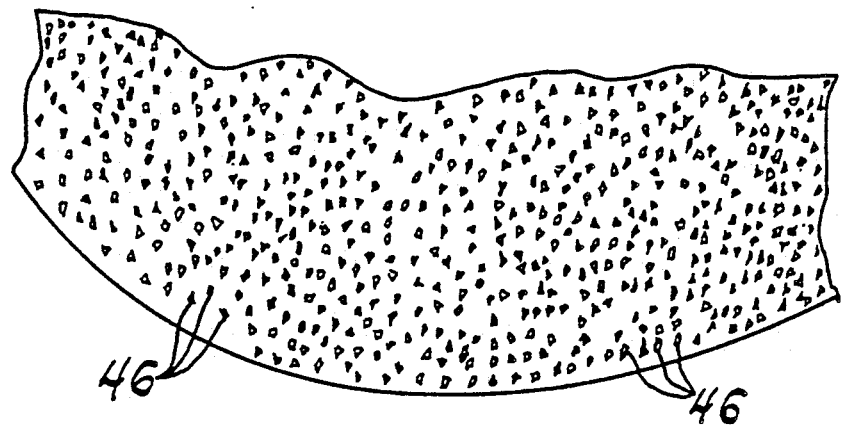
FIGS. 5 and 6 are facsimilies scanning electron photomicrographs of separated diamond particles on the supportive surface of a tool, respectively at 50× and 3800× magnification.
Figure 6:
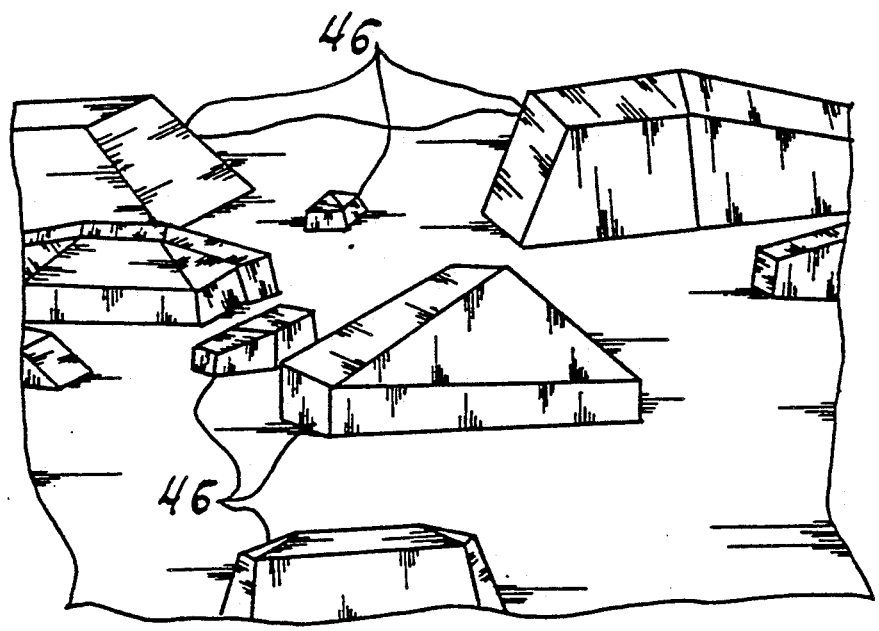

Diamond particles of approximate size of 10 microns in diameter are grown by a process of microwave plasma deposition at a frequency of 2.45 GHz in a reactor operating at 90 Torr total pressure of methane in hydrogen at a methane concentration of 1% at a first stage of 900° C. and a second stage at 1000° C. with total flow rate of 100 standard cubic centimeters per minute. The deposition time is on the order of 2-4 hours for the first stage and another 1-4 hours for the second stage. The condition of the nucleated and grown particles 50 on substrate 49 after stage two is schematically shown in FIG. 3 and by facsimile SEM in FIGS. 5 and 6. At the conclusion of the deposition step, the substrate may be permitted to slow cool to room temperature under vacuum at least at a pressure $10^{-4}$ Torr to permit hydrogen degassing of the substrate.

The binding material is applied to the diamond particle/tool assembly by the process of magnetron sputtering at ambient temperature conditions from a target of molybdenum. A film 51 of approximately 10 microns is applied to the tool (as shown schematically in FIG. 3). Following deposition of the metal layer, the assembly is reheated to deposit another layer of particles by CVD and again cooled to ambient to carry out PVD at ambient conditions. This was repeated to provide two layers each of the particles and binding material. Each time CVD was carried out following PVD of Mo, the initial stage of CVD converts the exposed surface of Mo to molybdenum carbide by preferential absorption of carbon from the chemical vapor prior to the formation of any diamond particles. The total thickness of the deposited layers, both particles and binding material, will be thicker than any coating ever contemplated or ever deposited by the prior art; the multiple layer will be about 50-125 microns, and should be at least 15 microns as a minimum.

Adherence Tests

The adherence of noncontiguous diamond particles produced by microwave-enhanced CVD, accompanied by a binding overlayer, was assessed by machining data on aluminum alloys. In the machining tests, several cutting tools or inserts were employed for comparisons. Uncoated substrates were used, one consisting of Co cemented WC, and the other SiAlON. Coated substrates consisted of (i) a contiguous diamond low pressure CVD film on SiAlON, (ii) a compacted polycrystalline diamond coating by high temperature and high pressure on diamond, and (iii) (projected) noncontiguous diamond low pressure CVD particles with an overlay of a binding layer in accordance with this invention.

The contiguous diamond low pressure CVD film on a SiAlON substrate was formed of a typical commercial grade configured in SNG 432 tool geometry. The substrate was polished prior to CVD by use of a sequence that concluded with 3 μm diamond paste. The diamond coating was seeded by use of light polishing with 0.25 μm diamond paste followed by rinsing in methanol. The only heat supplied to the substrate during deposition was via coupling to the microwave power, which was adjusted to yield a specimen temperature at the growth surface of 1000° C. as measured by optical pyrometry through a window in the growth tube. The system pressure was maintained at 90 Torr with total gas flow rate of 100 sccm. The feed gases were $CH_4/H_2$ mixtures at 1% or 2% methane. Total growth times were typically five hours, including nucleation time.

The coating of noncontiguous low pressure CVD diamond particles with the binding layer was on a Ni-Mo cemented TiCN substrate, deposited at conditions described in the preferred embodiment described earlier.

Cutting tests on aluminum-silicon alloys were performed in both turning and milling operations. Such tests reproduce the stress and temperature conditions experienced by cutting tools in actual practice. Turning studies were first conducted on an 8" diameter "log" of AA 333 aluminum (8–10% Si, 3–4% Cu) at speeds of 1000 and 2000 sfpm, with feeds of 0.014 and 0.007 ipr respectively, and 0.040" depth of cut. Uncoated SiAlON was used as a reference material. The resulting surface finish from the contiguous coated SiAlON tool was not much better (49–52 microinches) than for the uncoated SiAlON reference (88–92 microinches) after 30 minutes of cutting at 2000 sfm.

Figure 7:
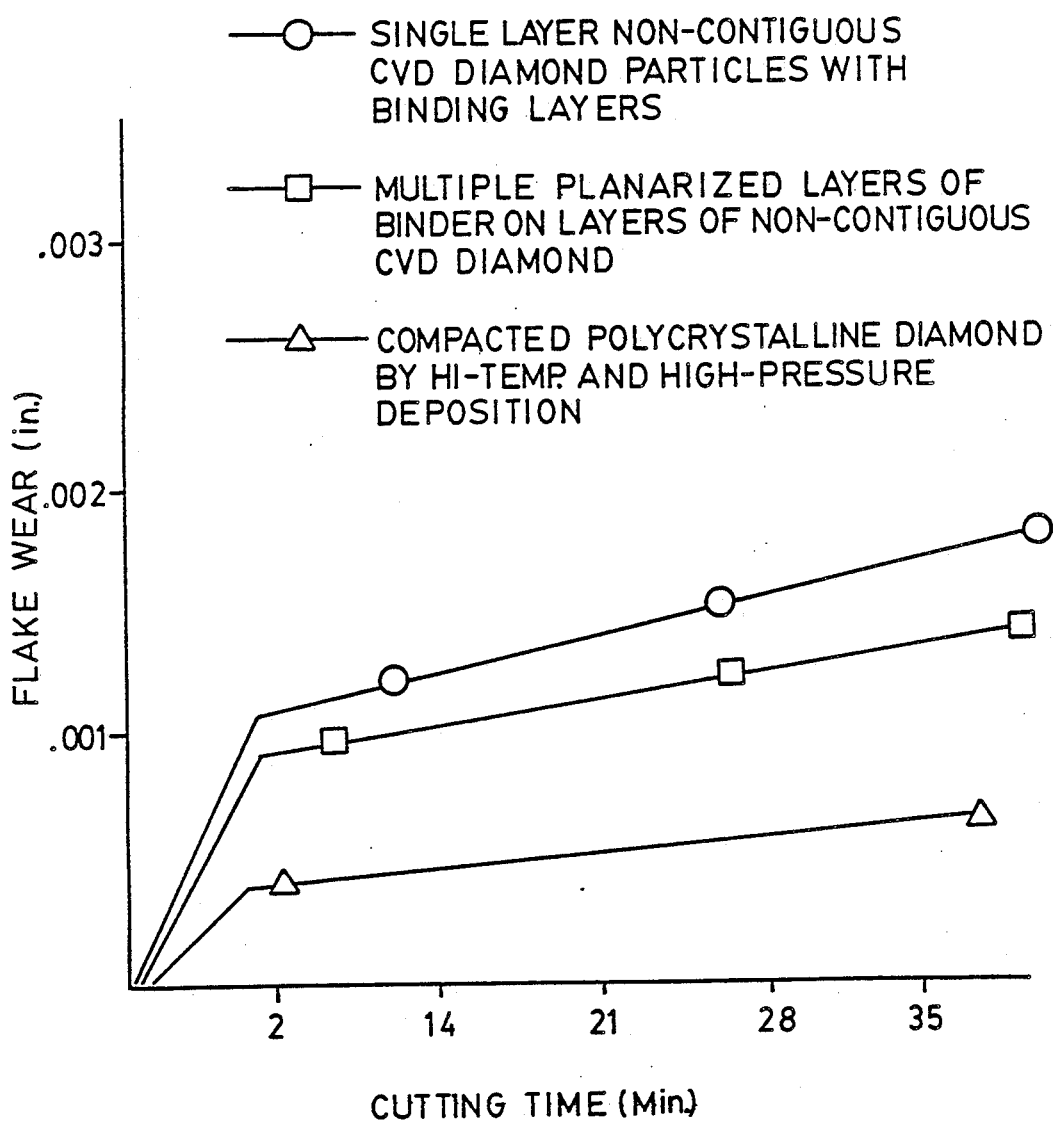
FIG. 7 is a projected graphical illustration of wear as a function of time as an indicator of coating adherence and toughness.

Milling tests were then conducted on a more difficult to machine alloy, AA 390 aluminum (nom. 16–18% Si, 4–5% Cu), at speeds of 544 and 1171 sfpm, with tool feed rate of 0.008 ipr and 0.060" depth of cut. These wear tests demonstrated that contiguous films of diamond particles on SiAlON is no better than uncoated SiAlON. However, planarized layers of binding material on multiple layers of noncontiguous (low pressure CVD) diamond particles provide a flank wear rate (as shown in FIG. 7) that approaches that of polycrystalline diamond deposited at high pressures and temperatures and is much better than a single layer of noncontiguous CVD diamond particles with the same type of binding material (but not planarized as in multiple layers).

While particular embodiments of the invention have been illustrated and described, it will be obvious to those skilled in the art that various changes and modifications may be made without departing from the invention, and it is intended to cover in the appended claims all such changes and equivalents that fall within the true spirit and scope of the invention.

What is claimed:

1. A diamond composite coated tool structure, comprising:
   (a) a tool substrate effective to retain strength related physical properties while experiencing temperatures of up to 1050° C. for up to 22 hours;
   (b) a plurality of layers of noncontiguous diamond or diamond-like crystals on said tool substrate; and
   (c) a plurality of planarized layers of binding material, each layer being interposed between or on the layers of diamond or diamond-like crystals and deposited at temperatures below 500° C.

2. A cutting tool, comprising:
   (a) a ceramic or fiber-filled composite substrate of generally desired cutting tool configuration;
   (b) a plurality of discontinuous diamond or diamond-like array of particles on at least a working surface of said substrate, said particles being the result of low pressure metastable CVD;
   (c) a plurality of planarized layers of binding material interposed between each layer of said particles and exposed supporting surface between said particles, said binding material being chemically and mechanically bonded to said particles and substrate and devoid of agents that poison diamond nucleation.

* * * * *